(12) United States Patent
Lee et al.

(10) Patent No.: US 10,815,561 B2
(45) Date of Patent: Oct. 27, 2020

(54) METHOD AND APPARATUS FOR ASYMMETRIC SELECTIVE PHYSICAL VAPOR DEPOSITION

(71) Applicant: APPLIED MATERIALS, INC., Santa Clara, CA (US)

(72) Inventors: Joung Joo Lee, San Jose, CA (US); Bencherki Mebarki, Santa Clara, CA (US); Xianmin Tang, San Jose, CA (US); Keith Miller, Mountain View, CA (US); Sree Rangasai Kesapragada, Union City, CA (US); Sudarsan Srinivasan, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 50 days.

(21) Appl. No.: 16/295,328

(22) Filed: Mar. 7, 2019

(65) Prior Publication Data
US 2019/0276926 A1    Sep. 12, 2019

Related U.S. Application Data

(60) Provisional application No. 62/641,324, filed on Mar. 10, 2018.

(51) Int. Cl.
*C23C 14/04* (2006.01)
*C23C 14/34* (2006.01)
(Continued)

(52) U.S. Cl.
CPC .............. *C23C 14/04* (2013.01); *C23C 14/34* (2013.01); *H01L 21/02266* (2013.01); *H01L 21/2855* (2013.01)

(58) Field of Classification Search
CPC .... C23C 14/04; C23C 14/34; H01L 21/02266
See application file for complete search history.

(56) References Cited

U.S. PATENT DOCUMENTS

| 4,664,935 A | 5/1987 | Strahl |
| 5,364,664 A | 11/1994 | Tsubouchi et al. |
| (Continued) | | |

FOREIGN PATENT DOCUMENTS

| CN | 102184961 A | 9/2011 |
| JP | 08-269710 | 10/1996 |
| (Continued) | | |

OTHER PUBLICATIONS

International Search Report and Written Opinion for PCT/US2019/021123, dated Jun. 17, 2019.
(Continued)

*Primary Examiner* — Errol V Fernandes
(74) *Attorney, Agent, or Firm* — Moser Taboada

(57) ABSTRACT

Methods and apparatus for asymmetric selective physical vapor deposition (PVD) are provided herein. In some embodiments, a method for physical vapor deposition (PVD) includes providing a stream of a first material from a first PVD source towards a surface of a substrate at a first non-perpendicular angle to the plane of the substrate surface, directing the stream of the first material through a first collimator having at least one opening to limit an angular range of first material passing through the at least one opening; depositing the first material only on a top portion and a first sidewall of at least one feature formed on the substrate surface, and linearly scan the substrate through the stream of first material via the substrate support to deposit the first material only on a top portion and a first sidewall of all features formed on the substrate.

20 Claims, 10 Drawing Sheets

(51) Int. Cl.
*H01L 21/285* (2006.01)
*H01L 21/02* (2006.01)

(56) References Cited

U.S. PATENT DOCUMENTS

| | | |
|---|---|---|
| 5,393,699 A | 2/1995 | Mikoshiba et al. |
| 5,858,471 A | 6/1999 | Ray et al. |
| 5,985,102 A | 11/1999 | Leiphart |
| 6,063,707 A | 5/2000 | Atwater et al. |
| 6,784,096 B2 | 8/2004 | Chen et al. |
| 6,911,671 B2 | 6/2005 | Marcus et al. |
| 7,022,209 B2 | 4/2006 | Sabisch et al. |
| 9,716,005 B1 | 7/2017 | Godet et al. |
| 2002/0100424 A1 | 8/2002 | Sun et al. |
| 2005/0067272 A1* | 3/2005 | Pelhos ................ H01J 37/3447 204/192.12 |
| 2007/0108404 A1 | 5/2007 | Stewart et al. |
| 2009/0186159 A1 | 7/2009 | Mitchell et al. |
| 2011/0033612 A1 | 2/2011 | McLeod |
| 2012/0103794 A1 | 5/2012 | Jung et al. |
| 2016/0181134 A1* | 6/2016 | Budiarto .................. G03F 1/22 438/7 |
| 2016/0341544 A1* | 11/2016 | Foad .................. G01B 11/0625 |
| 2017/0178877 A1 | 6/2017 | Wang et al. |
| 2017/0350004 A1 | 12/2017 | Kaufman-Osborn et al. |

FOREIGN PATENT DOCUMENTS

| | | |
|---|---|---|
| JP | H10223566 A | 8/1998 |
| KR | 10-2017-0020681 A | 2/2017 |

OTHER PUBLICATIONS

International Search Report for PCT/US2018/065961, dated Apr. 15, 2019.
U.S. Appl. No. 16/222,005, filed Dec. 17, 2018.

* cited by examiner

METHOD AND APPARATUS FOR ASYMMETRIC SELECTIVE PHYSICAL VAPOR DEPOSITION

CROSS-REFERENCE TO RELATED APPLICATIONS

This application claims benefit of U.S. provisional patent application Ser. No. 62/641,324, filed Mar. 10, 2018 which is herein incorporated by reference in its entirety.

FIELD

Embodiments of the present disclosure generally relate to substrate processing equipment, and more particularly, to methods and apparatus for depositing materials via physical vapor deposition.

BACKGROUND

The semiconductor processing industry generally continues to strive for increased uniformity of layers deposited on substrates. For example, with shrinking circuit sizes leading to higher integration of circuits per unit area of the substrate, increased uniformity is generally seen as desired, or required in some applications, in order to maintain satisfactory yields and reduce the cost of fabrication. Various technologies have been developed to deposit layers on substrates in a cost-effective and uniform manner, such as chemical vapor deposition (CVD) or physical vapor deposition (PVD).

However, the inventor has observed that with the drive to produce equipment to deposit more uniformly, certain applications may not be adequately served where purposeful deposition is used that is not symmetric or uniform with respect to the given structures being fabricated on a substrate.

Accordingly, the inventor has provided improved methods and apparatus for depositing materials via physical vapor deposition.

SUMMARY

Methods and apparatus for asymmetric selective physical vapor deposition (PVD) are provided herein. In some embodiments, a method for physical vapor deposition (PVD) includes providing a stream of a first material from a first PVD source towards a surface of a substrate at a first non-perpendicular angle to the plane of the substrate surface, directing the stream of the first material through a first collimator having at least one opening to limit an angular range of first material passing through the at least one opening; depositing the first material only on a top portion and a first sidewall of at least one feature formed on the substrate surface, and linearly scan the substrate through the stream of first material via the substrate support to deposit the first material only on a top portion and a first sidewall of all features formed on the substrate.

In some embodiments, a method for forming structures by asymmetric selective physical vapor deposition (PVD) may include providing a stream of a first material from a first PVD source towards a surface of a substrate at a first non-perpendicular angle to the substrate surface; providing a second stream of the first material from a second PVD source towards a surface of a substrate at a second non-perpendicular angle to the substrate surface; directing the first and second streams of the first material through a collimator having a plurality of openings to limit the angular ranges of the first and second streams of first material passing through the plurality of openings; and linearly scanning the substrate through the first and second streams of the first material via a substrate support to deposit the first material only on (1) a top portion and (2) both a first sidewall and a second sidewall of all features formed on the substrate.

In some embodiments, an apparatus for forming structures by asymmetric selective physical vapor deposition (PVD) may include a first PVD source configured to provide a stream of a first material from towards a surface of a substrate at a first non-perpendicular angle to the substrate surface, wherein the first PVD source is configured to rotate to adjust the angle at which the stream of first material contacts the substrate surface; and a collimator having at least one opening to limit an angular range of first material passing through the at least one opening, wherein the collimator is configured to move linearly to control the angle at which the stream of first material contacts the substrate surface.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
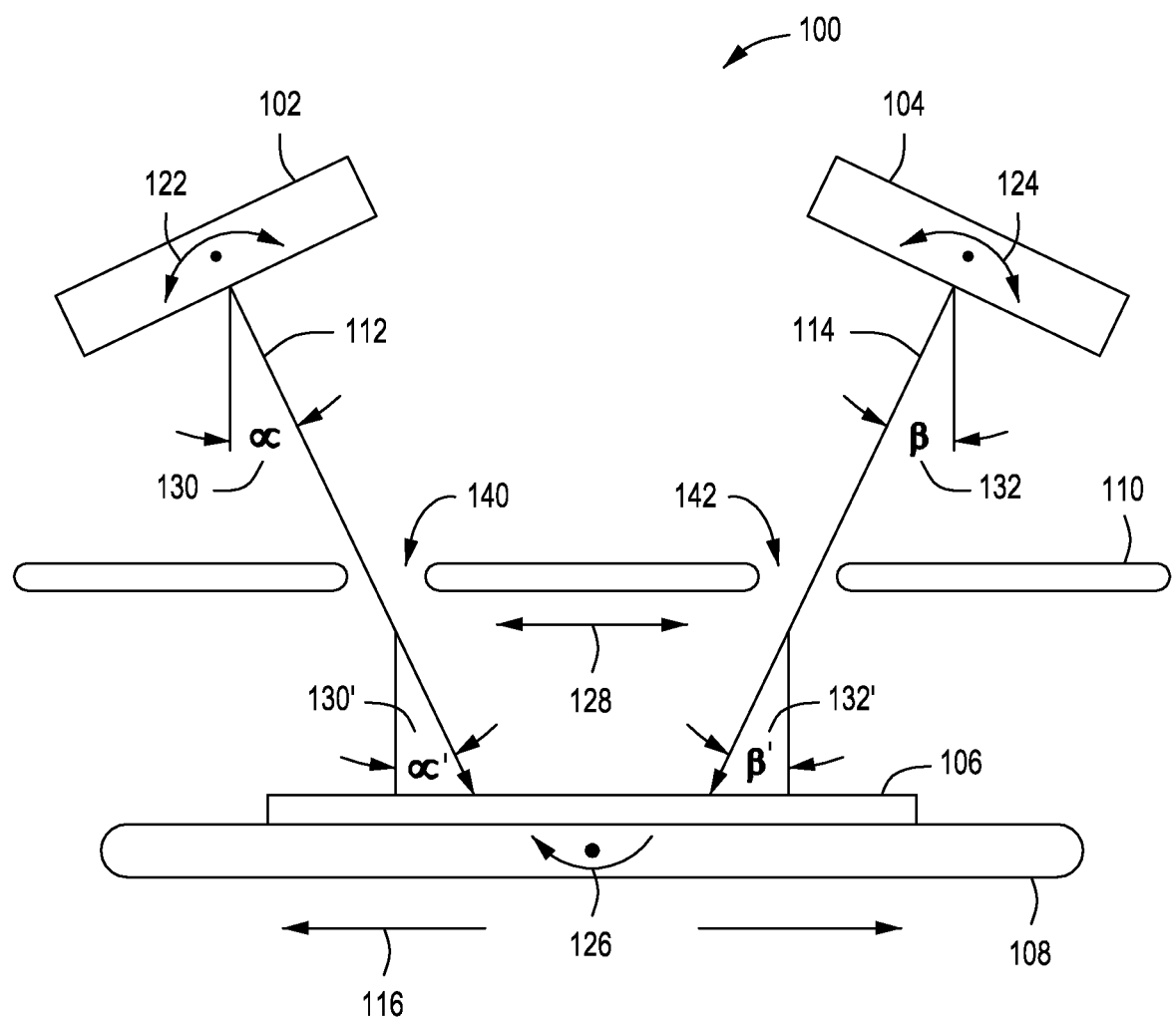
FIG. 1 depicts a schematic diagram of an apparatus used for PVD deposition of material on substrates in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for asymmetric selective physical vapor deposition (PVD) are provided herein. Embodiments of the disclosed methods and apparatus advantageously enable uniform angular deposition of materials on a substrate. In such applications, deposited materials are asymmetric or angular with respect to a given feature on a substrate, but can be relatively uniform within all features across the substrate. Embodiments of the disclosed methods and apparatus advantageously enable new applications or opportunities for selective PVD of materials, thus further enabling new markets and capabilities. Furthermore, embodiments of the disclosed methods and apparatus advantageously can be used for fin selective doping and oxidation, selective spacer for a silicon fin, selective sidewall contact (e.g. Ti on Si), asymmetric deposition for tighter end-to-end spacing without extreme ultraviolet (EUV) lithography masks, asymmetric fin stressor for channel mobility, selective etch hard masks, Si fin protection layer, selective barrier deposition for low via R metallization with overhang control, spacer deposition for SAXP, line edge roughness control for etch hard mask, pattern CD, and profile modulation.

FIG. 1 is a schematic side view of an apparatus 100 for PVD in accordance with at least some embodiments of the present disclosure. Specifically, FIG. 1 schematically depicts an apparatus 100 for PVD of materials on a substrate at an angle to the generally planar surface of the substrate. The apparatus 100 generally includes a first PVD source 102, a substrate support 108 for supporting a substrate 106, and at least one collimator 110. The first PVD source 102 is configured to provide a first directed stream of material flux (stream 112 as depicted in FIG. 1) from the source toward the substrate support 108 (and any substrate 106 disposed on the substrate support 108). In some embodiments, the apparatus 100 includes a second PVD source 104 configured to provide a second directed stream of material flux (stream 114 as depicted in FIG. 1) from the source toward the substrate support 108 (and any substrate 106 disposed on the substrate support 108). The substrate support has a support surface to support the substrate such that a working surface of the substrate to be deposited on is exposed to the first stream 112 and second stream 114 of material flux. The streams 112, 114 of material flux provided by the first and second PVD sources 102, 104 have a width greater than that of the substrate support 108 (and any substrate 106 disposed on the substrate support 108). The streams 112, 114 of material flux have a linear elongate axis corresponding to the width of the streams 112, 114 of material flux. The substrate support 108 is configured to move linearly with respect to the first and second PVD sources 102, 104, as indicated by arrows 116. Optionally, the substrate support 108 may additionally be configured to rotate about its z-axis or tilt about its y-axis, as indicated by arrow 116.

The first and second PVD sources 102, 104 include target material to be sputter deposited on the substrate. In some embodiments, the target material of the first and second PVD sources 102, 104 are the same target material. In other embodiments, the target material provided by the first and second PVD sources 102, 104 are different from each other. In some embodiments, the target material can be, for example, a metal, such as titanium, or the like, suitable for depositing titanium (Ti) or titanium nitride (TiN) on the substrate. In some embodiments, the target material can be, for example, silicon, or a silicon-containing compound, suitable for depositing silicon (Si), silicon nitride (SiN), silicon oxynitride (SiON), or the like on the substrate. Other materials may suitably be used as well in accordance with the teachings provided herein. The linear PVD source 102 further includes, or is coupled to, a power source to provide suitable power for forming a plasma proximate the target material and for sputtering atoms off of the target material. The power source can be either or both of a DC or an RF power source.

In some embodiments, unlike an ion beam or other ion source, the first and second PVD sources 102, 104 are configured to provide mostly neutrals and few ions of the target material. As such, a plasma may be formed having a sufficiently low density to avoid ionizing too many of the sputtered atoms of target material. For example, for a 300 mm diameter wafer as the substrate, about 1 to about 20 kW of DC or RF power may be provided. The power or power density applied can be scaled for other size substrates. In addition, other parameters may be controlled to assist in providing mostly neutrals in the streams 112, 114 of material flux. For example, the pressure may be controlled to be sufficiently low so that the mean free path is longer than the general dimensions of an opening of the first and second PVD sources 102, 104 through which the stream of material flux passes toward the substrate support 108 (as discussed in more detail below). In some embodiments, the pressure may be controlled to be about 0.5 to about 5 millitorr.

In embodiments consistent with the present disclosure, the lateral angles of incidence of the first and second streams of material flux can be controlled. For example, FIG. 1 depicts apparatus 100 illustrating material deposition angle α 130 of the first stream 112 from the first PVD source 102 and angle β 132 of the second stream 114 from the second PVD source 104 in accordance with at least some embodiments of the present disclosure. In some embodiments, the angles α 130 and β 132 can either be fixed or adjustable by rotating the first PVD source 102 as shown by arrow 122, and/or rotating the second PVD source 104 as shown by arrow 124.

As discussed above the apparatus includes at least one collimator 110. In some embodiments, the collimator 110 is a physical structure such as a shroud, disk, or a plurality of baffles that have one or more openings 140, 142 that is interposed between the PVD sources 102, 104 and the substrate 106 such that the streams 112, 114 of material flux travels through the structure (e.g., collimator 110). Any materials with an angle to great to pass through the openings 140, 142 of the collimator 110 will be blocked, thus limiting the permitted angular range of materials reaching the surface of substrate 106. In some embodiments, the collimator 110 may include a single opening. In other embodiments, the apparatus 100 may include a single collimator 110 having multiple openings. Still, in other embodiments, the collimator may be comprised of multiple collimators, each having one or more openings. As used herein, the collimator functions as a spread angle control apparatus that controls the angle of the spread of materials being sputtered from the first and/or second PVD sources. In some embodiments, the one or more collimators 110 can move linearly as shown by arrow 128.

In some embodiments, the angle of incidence 130', 132' at which the streams of material 112, 114 actually contact the substrate surface may be different than the angle of incidence 130, 132 at which the streams of material are provide by the first PVD source 102 and the second PVD source 104. The angle of incidence 130', 132' at which the streams of material 112, 114 actually contact the substrate surface can be controlled/altered by one or more of the following: the angle of incidence 130, 132 at which the streams of material are provided by the first PVD source 102 and the second PVD source 104, the number and placement of openings in collimator 110, the linear position of collimator 110, and the rotation 126 of the substrate support about the y-axis.

Figure 2:
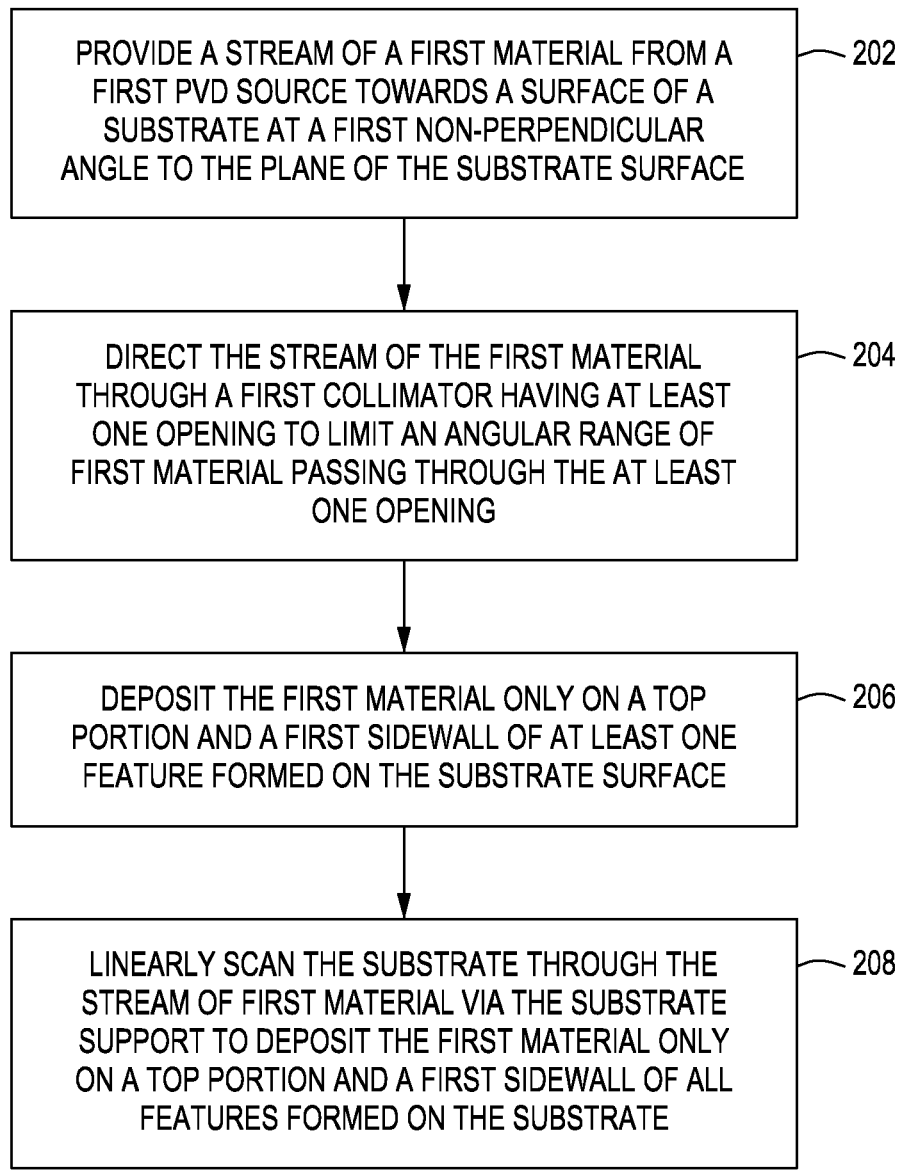
FIG. 2 depicts a flow chart of a method for PVD deposition of material on substrates in accordance with some embodiments of the present disclosure.
Figure 3:
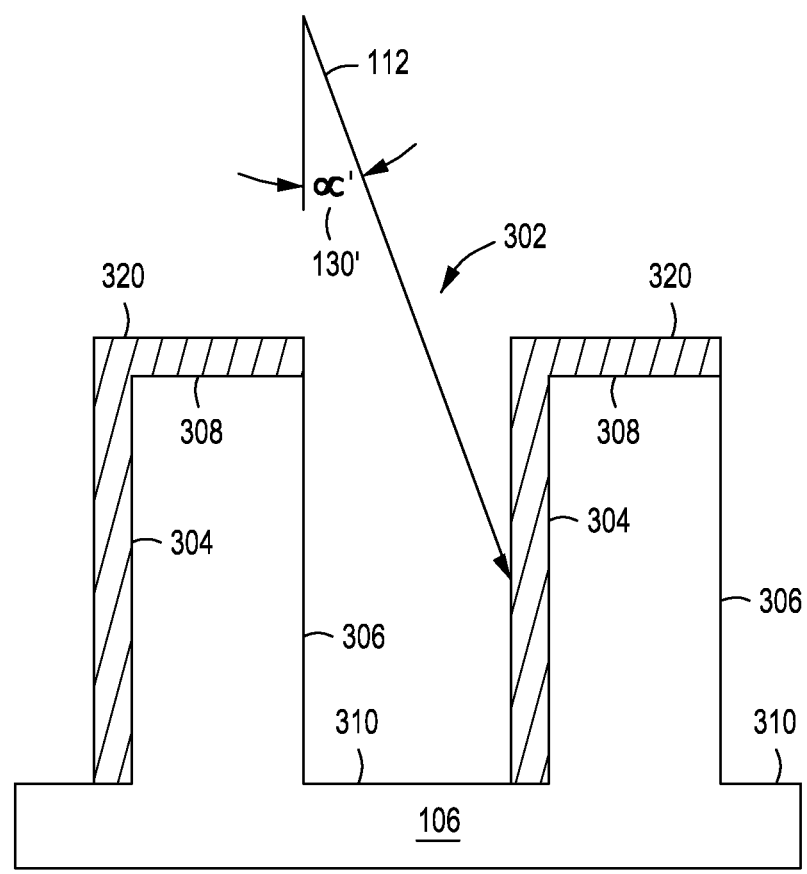
FIG. 3 depicts a schematic side view of a substrate including features having a layer of material deposited thereon in accordance with at least some embodiments of the present disclosure.

The methods and embodiments disclosed herein advantageously enable deposition of materials with a shaped profile, or in particular, with an asymmetric profile with respect to a given feature on a substrate, while maintaining overall deposition and shape uniformity across all features on a substrate. For example, FIG. 2 depicts a flow diagram of a method 200 for depositing target material 320 on features 302 formed on the substrate surface 106 as shown in FIG. 3. Specifically, FIG. 3 depicts a schematic side view of a substrate 106 including features 302 having a layer of material 320 deposited thereon in accordance with at least some embodiments of the present disclosure. The feature 302 can be a fin, trench, a via, or dual damascene feature, or the like. In addition, the feature 302 can protrude from the substrate rather than extend into the substrate. Each feature 302 includes a top portion 308, a first sidewall 304, a second sidewall 306, and a bottom portion 310.

The method 200 for depositing target material 320 on features 302 formed on the substrate surface 106 as shown in FIG. 3, begins at 202 where a first stream of material 112 is provided from a first PVD source 102 towards a surface of a substrate 106 at a first non-perpendicular angle to the plane of the substrate surface.

At 204, the stream of the first material is directed through a first collimator having at least one opening to limit the angular range of the first material passing through the at least one opening of the collimator 110. In some embodiments, it is the combination of (1) the angle of the stream provided by the first PVD source and (2) the physical structure and placement of the collimator that controls the angle of incidence 130' that the stream of first material contacts the surface of the substrate. By controlling the angle of incidence 130', asymmetric deposition of the target material onto the features can be accomplished. Specifically, at 206 the first material is deposited only on the top portion and a first side wall of at least one feature formed on the substrate surface. Then, at 208, the substrate is moved linearly via the substrate support (i.e., linearly scanned) through the stream of first material to deposit the first material only on a top portion and a first sidewall of all features formed on the substrate. As shown in FIG. 3, there is no material deposition on the second sidewall 306 and little or no material is deposited on the bottom portion 310 of the feature. In some embodiments, there is no deposition on the bottom portion 310 of feature 302 except in the corner where the bottom portion meets the first sidewall 304. In some embodiments, there is no material deposition on the bottom portion 310 at all. Also, as shown in FIG. 3, the deposition of material 320 on the first sidewall 304 extends from the top portion 308 to the bottom portion 310 of feature 302.

Figure 4:
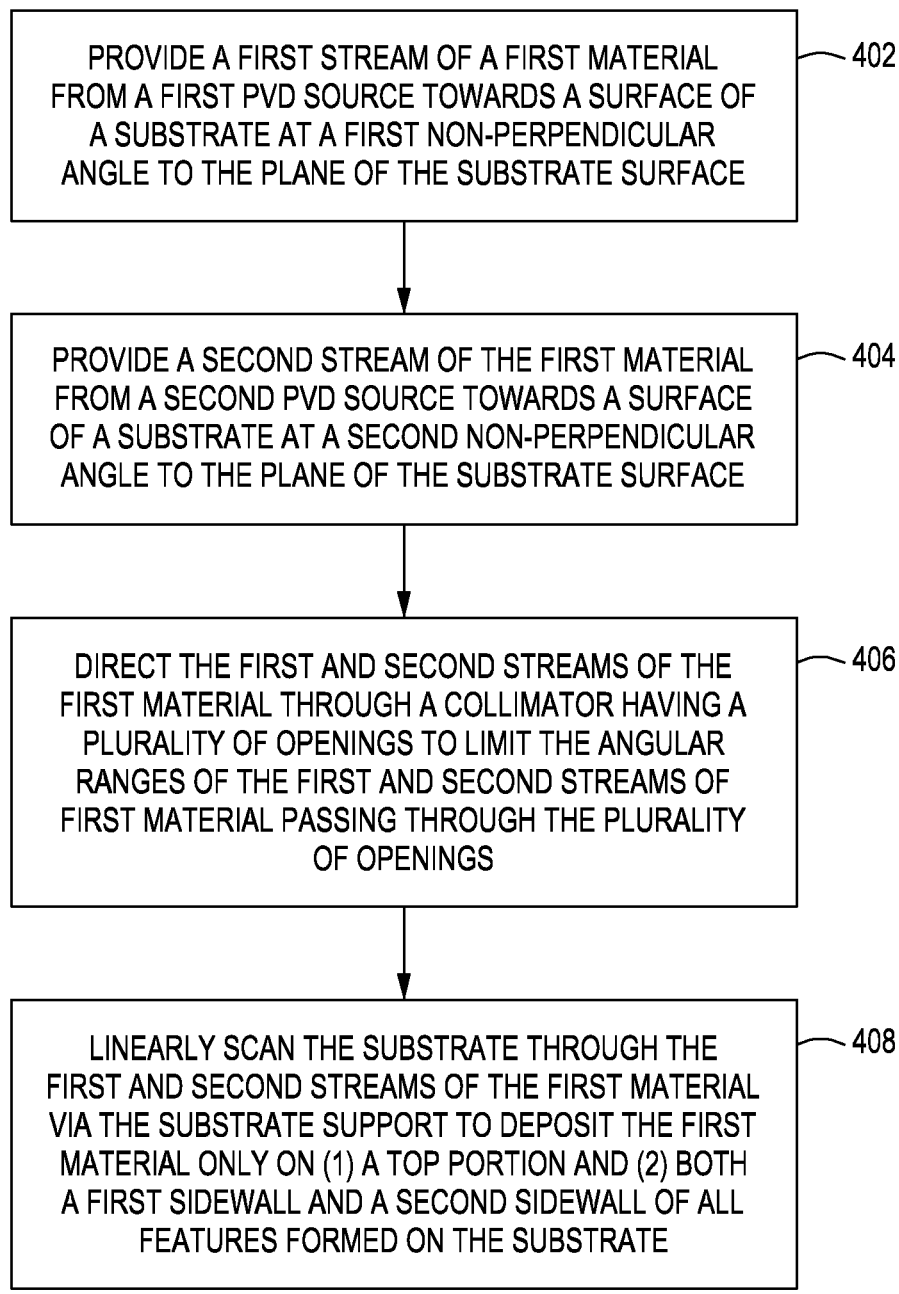
FIG. 4 depicts a schematic diagram of an apparatus used for PVD deposition of material on substrates in accordance with some embodiments of the present disclosure.
Figure 5:
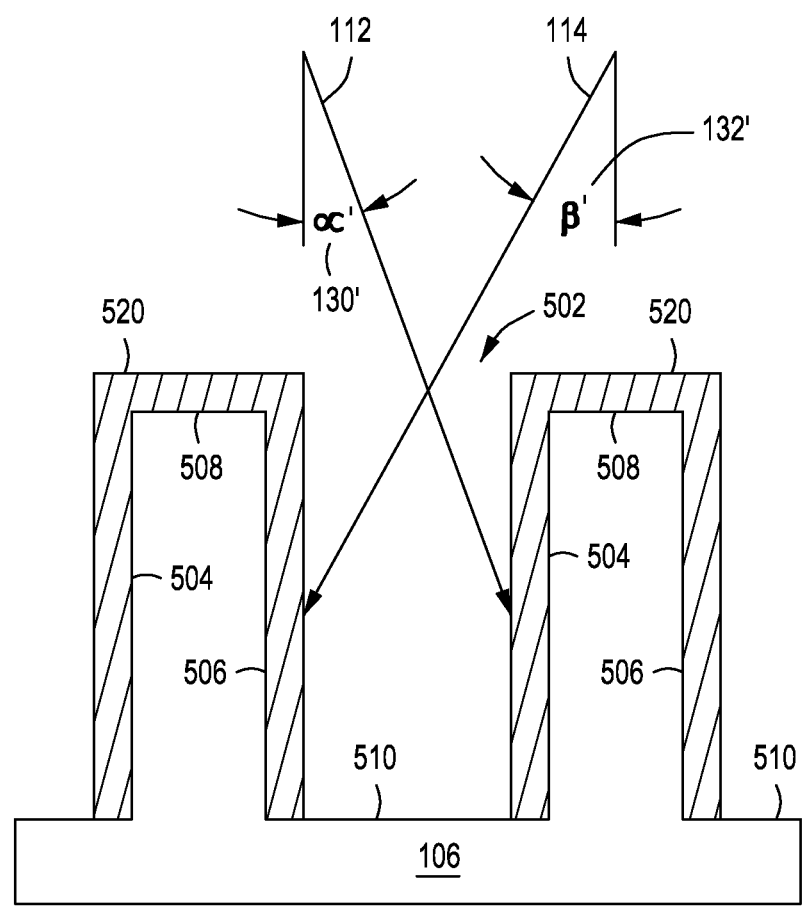
FIG. 5 depicts a flow chart of a method for PVD deposition of material on substrates in accordance with some embodiments of the present disclosure.

FIG. 4 depicts a flow diagram of a method 400 for depositing target material 520 on features 502 formed on the substrate surface 106 as shown in FIG. 5. Specifically, FIG. 5 depicts a schematic side view of a substrate 106 including features 502 having a layer of material 520 deposited thereon in accordance with at least some embodiments of the present disclosure. The feature 502 can be a fin, trench, a via, or dual damascene feature, or the like. In addition, the feature 502 can protrude from the substrate rather than extend into the substrate. Each feature 502 includes a top portion 508, a first sidewall 504, a second sidewall 506, and a bottom portion 510.

The method 400 for depositing target material 520 on features 502 formed on the substrate surface 106 as shown in FIG. 5, begins at 402 where a first stream 112 of a first material is provided from a first PVD source 102 towards the surface of substrate 106 at a first non-perpendicular angle to the plane of the substrate surface. At 404, a second stream 114 of the first material is provided from the second PVD source 104 towards the surface of substrate 106 and a second non-perpendicular angle to the plane of the substrate surface.

At 406, the first stream 112 of the first material is directed through a first collimator having at least one opening to limit the angular range of the first material passing through at least one opening of the collimator 110. In addition, at 406, a second stream 114 of the first material is also directed through another opening in the first collimator, or through an opening in a separate different collimator. In some embodiments, it is the combination of (1) the angle of the streams provided by the first and second PVD sources and (2) the physical structure and placement of the collimator(s) that controls the angles of incidence 130', 132' that the streams 112, 114 of first material contacts the surface of the substrate. By controlling the angles of incidence 130', 132', the desired deposition of the target material onto the features can be accomplished. Specifically, at 408, the substrate is moved linearly via the substrate support (i.e., linearly scanned) through the streams 112, 114 of the first material to deposit the first material only on (1) a top portion and (2) both a first sidewall and a second sidewall of all features formed on the substrate. As shown in FIG. 5, there is little or no material is deposited on the bottom portion 510 of the feature. In some embodiments, there is no deposition on the bottom portion 510 of feature 502 except in the corners where the bottom portion meets the first sidewall 504 and the second sidewall 506. In some embodiments, there is no material deposition on the bottom portion 510 at all. Also, as shown in FIG. 5, the deposition of material 520 on the first sidewall 504 and the second sidewall 506 extends from the top portion 508 to the bottom portion 510 of feature 502.

Figure 6:
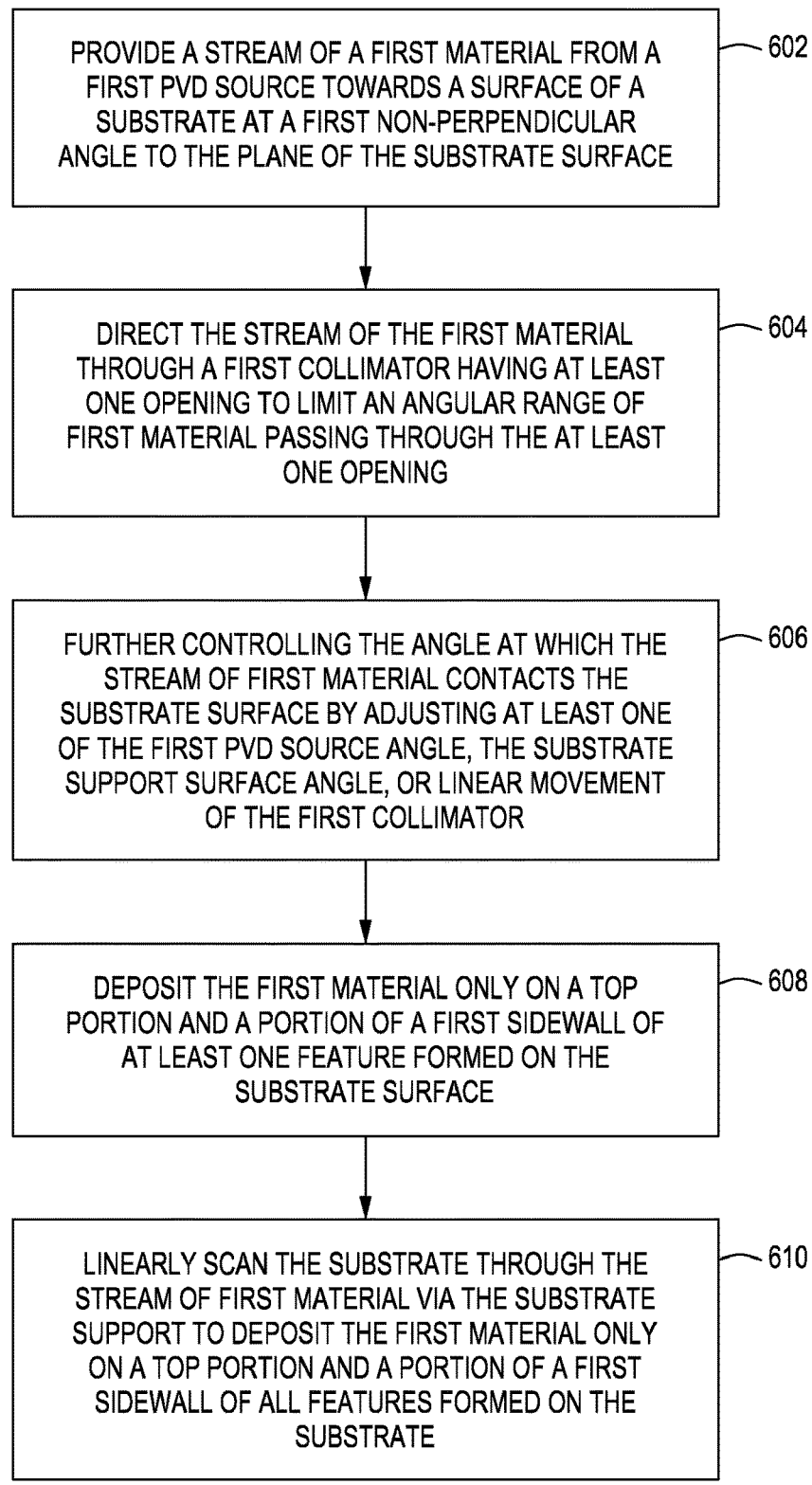
FIG. 6 depicts a schematic side view of a substrate including features having a layer of material deposited thereon in accordance with at least some embodiments of the present disclosure.
Figure 7:
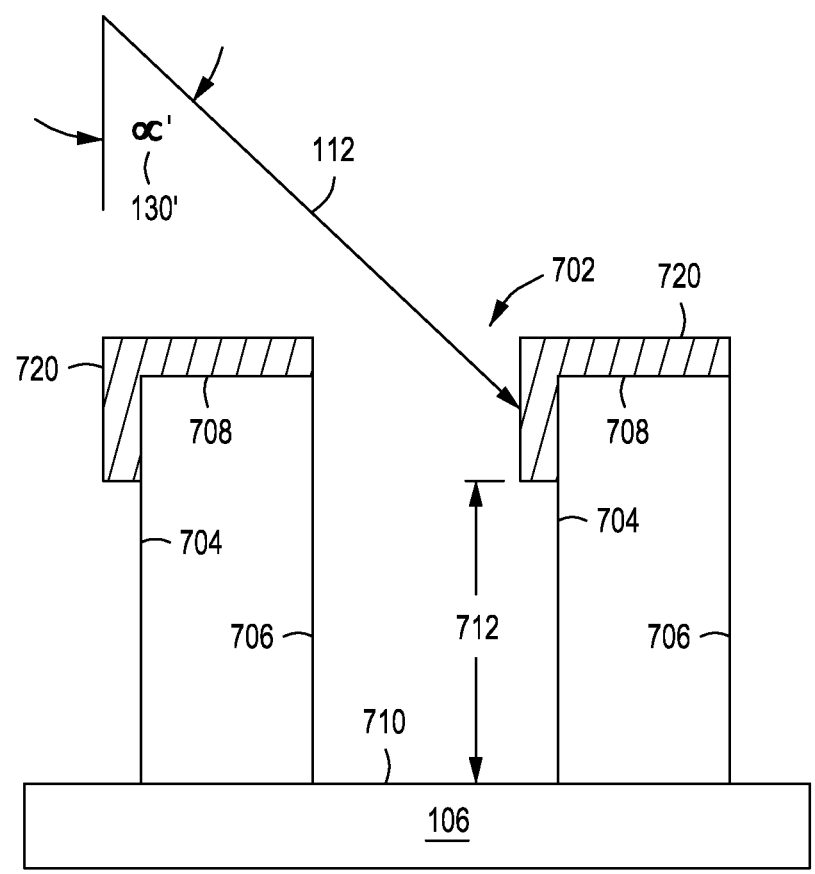
FIG. 7 depicts a schematic diagram of an apparatus used for PVD deposition of material on substrates in accordance with some embodiments of the present disclosure.

FIG. 6 depicts a flow diagram of a method 600 for depositing target material 720 on features 702 formed on the substrate surface 106 as shown in FIG. 7. Specifically, FIG. 7 depicts a schematic side view of a substrate 106 including features 702 having a layer of material 720 deposited thereon in accordance with at least some embodiments of the present disclosure. The feature 702 can be a fin, trench, a via, or dual damascene feature, or the like. In addition, the feature 702 can protrude from the substrate rather than extend into the substrate. Each feature 702 includes a top portion 708, a first sidewall 704, a second sidewall 706, and a bottom portion 710.

The method 600 for depositing target material 720 on features 702 formed on the substrate surface 106 as shown in FIG. 7, begins at 602 where a first stream 112 of a first material is provided from a first PVD source 102 towards the surface of substrate 106 at a first non-perpendicular angle to the plane of the substrate surface. At 604, a second stream 114 of the first material is provided from the second PVD source 104 towards the surface of substrate 106 and a second non-perpendicular angle to the plane of the substrate surface.

At 606, the stream of the first material is directed through a first collimator having at least one opening to limit the angular range of the first material passing through the at least one opening of the collimator 110. At 606, the angle at which the stream of first material contacts substrate surface further control by adjusting at least one of the first PVD source angle, the substrate support surface angle, or the linear movement of the first collimator. For example, in some embodiments, minor adjustments or fine tuning of the angle of impingement of the stream of first material on the surface of the substrate can be accomplished by tilting the substrate support about its y-axis, and therefore the substrate surface, by a small amount (e.g., about 1 degree to about 10 degrees). In some embodiments, the linear movement of the collimator 110 can be used to adjust the angle of incidence that the stream first material contacts the substrate surface (discussed in more detail below with respect to FIG. 10.) In this way, the height 712 of the deposition of material 720 on sidewalls 704 from the bottom portion 710 can be precisely controlled.

At 608 the first material is deposited only on the top portion and a portion of the first sidewall 704 of at least one feature formed on the substrate surface. Then, at 610, the substrate is moved linearly via the substrate support (i.e., linearly scanned) through the stream of first material to deposit the first material only on a top portion and a portion of the first sidewall of all features formed on the substrate. As shown in FIG. 7, there is no material deposition along (1) the height 712 of the deposition of material 720 on sidewalls 704 from the bottom portion 710, (2) the second sidewall 706, and (3) the bottom portion 710 of the feature.

Figure 8:
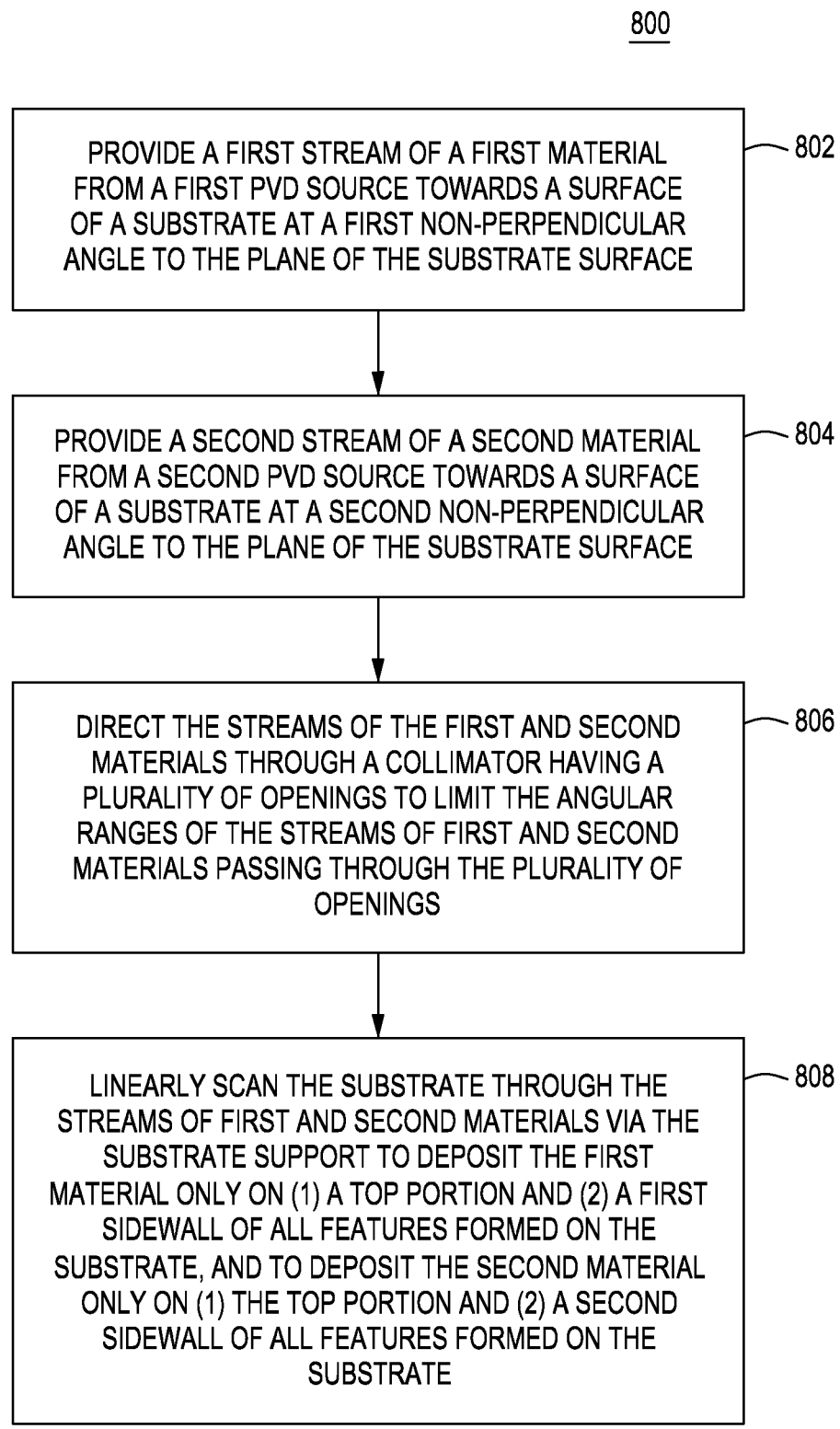
FIG. 8 depicts a flow chart of a method for PVD deposition of material on substrates in accordance with some embodiments of the present disclosure.
Figure 9:
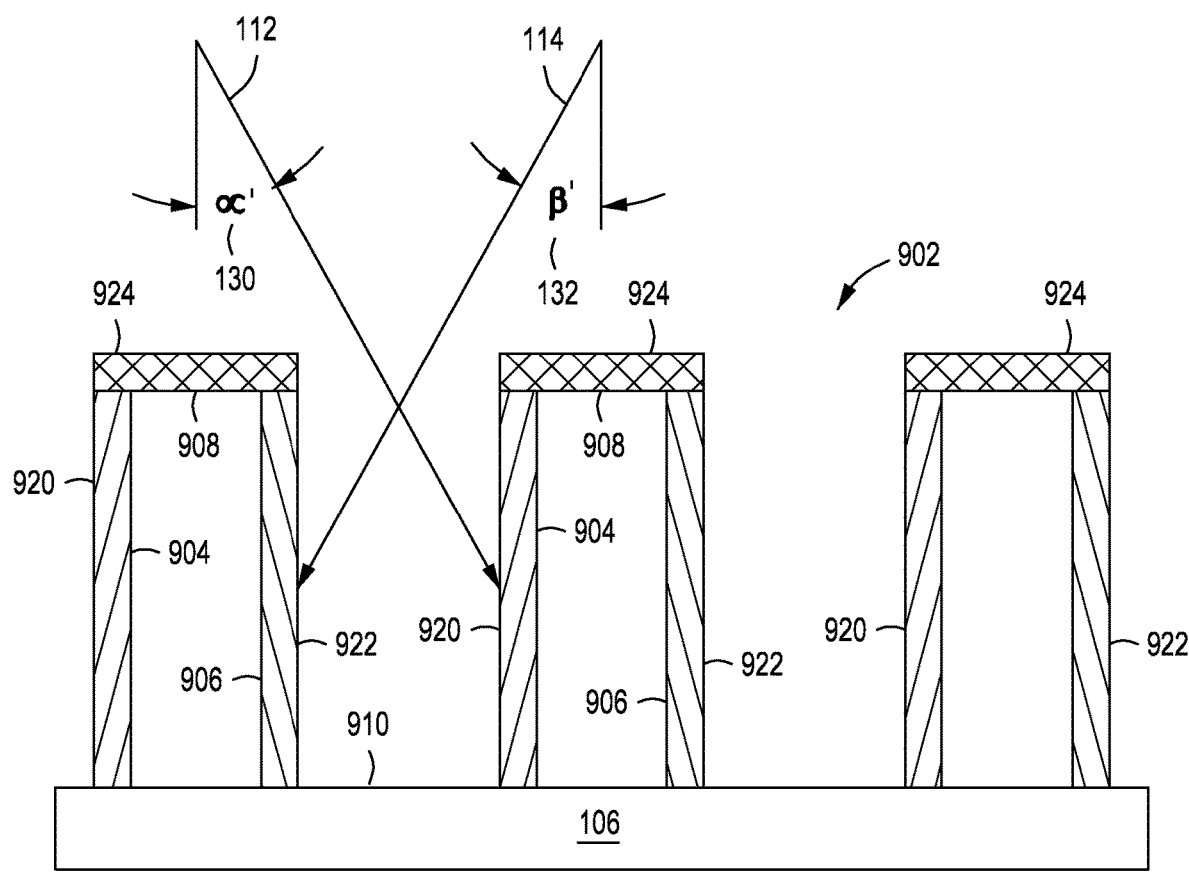
FIG. 9 depicts a schematic side view of a substrate including features having a layer of material deposited thereon in accordance with at least some embodiments of the present disclosure.

FIG. 8 depicts a flow diagram of a method 800 for depositing two different target materials 920, 922 on features 902 formed on the substrate surface 106 as shown in FIG. 9. Specifically, FIG. 9 depicts a schematic side view of a substrate 106 including features 902 having both target materials 920 and 922, and a combination of the two materials (i.e., mixture 924), deposited thereon in accordance with at least some embodiments of the present disclosure. The feature 902 can be a fin, trench, a via, or dual damascene feature, or the like. In addition, the feature 902 can protrude from the substrate rather than extend into the substrate. Each feature 902 includes a top portion 908, a first sidewall 904, a second sidewall 906, and a bottom portion 910.

The method 800 for depositing target materials 920 and 922 on features 902 formed on the substrate surface 106 as shown in FIG. 9, begins at 802 where a first stream 112 of a first material 920 is provided from a first PVD source 102 towards the surface of substrate 106 at a first non-perpendicular angle to the plane of the substrate surface. At 804, a second stream 114 of a second material 922 is provided from the second PVD source 104 towards the surface of substrate 106 and a second non-perpendicular angle to the plane of the substrate surface.

At 806, the first stream 112 of the first material 920 is directed through a first collimator having at least one opening to limit the angular range of the first material 920 passing through at least one opening of the collimator 110. In addition, at 806, a second stream 114 of the second material 922 is also directed through another opening in the first collimator, or through an opening in a separate different collimator. In some embodiments, it is the combination of (1) the angle of the streams provided by the first and second PVD sources and (2) the physical structure and placement of the collimator(s) that controls the angles of incidence 130', 132' that the stream 112 of the first material 920 and the stream 114 of the second material 922 contacts the surface of the substrate. By controlling the angles of incidence 130', 132', the desired deposition of the target material onto the features can be accomplished. Specifically, at 808, the substrate is moved linearly via the substrate support (i.e., linearly scanned) through the first streams 112 of the first material 920 and the second stream 114 of the second material 922 to deposit the first material 920 only on (1) a top portion and (2) a first sidewall of all features formed on the substrate, and to deposit the second material 922 only on (1) the top portion and (2) a second sidewall of all features formed on the substrate. As shown in FIG. 9, the top portion 908 of feature 902 has a mixture 924 that is comprised of both the first material 920 and the second material 922. Also, as shown in FIG. 9, there is little or no material is deposited on the bottom portion 910 of the feature. In some embodiments, there is no deposition on the bottom portion 910 of feature 902 except in the corners where the bottom portion meets the first sidewall 904 and the second sidewall 906. In some embodiments, there is no material deposition on the bottom portion 910 at all. Also, as shown in FIG. 9, the deposition of material 920 on the first sidewall 904 and the second sidewall 906 extends from the top portion 908 to the bottom portion 910 of feature 902.

Figure 10:
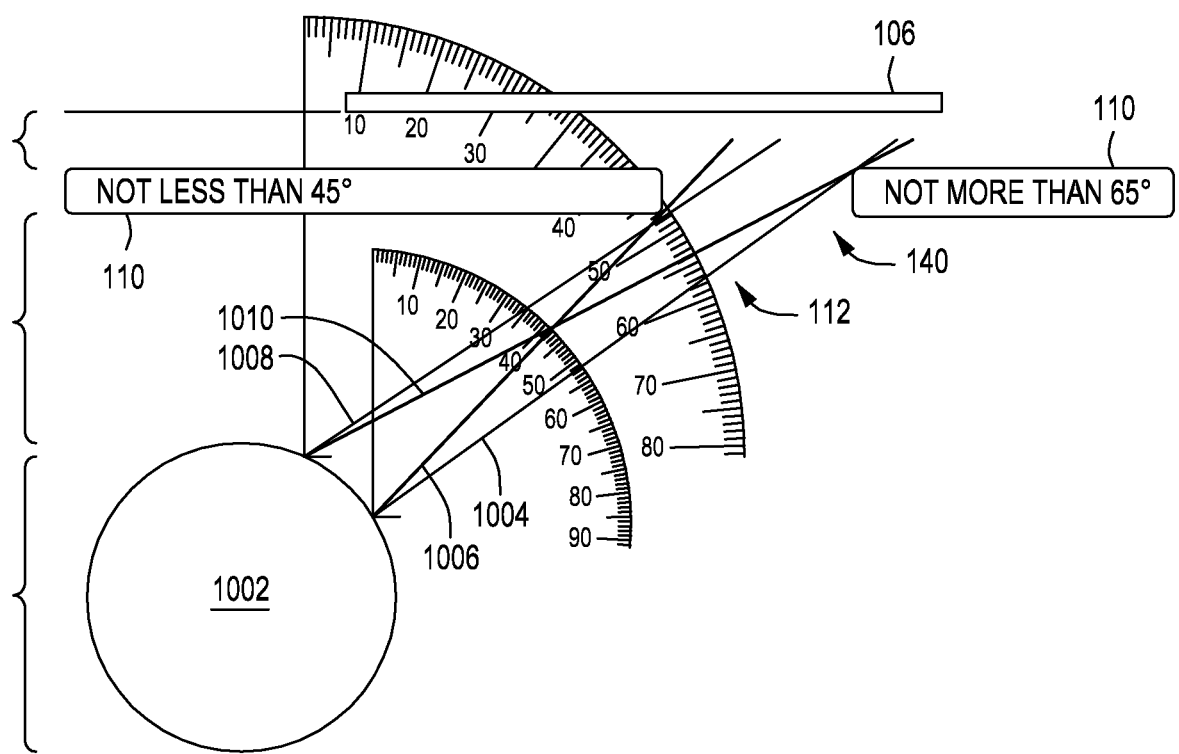
FIG. 10 depicts schematic top and side views of an apparatus for physical vapor deposition illustrating material deposition angles in accordance with at least some embodiments of the present disclosure.

FIG. 10 is a schematic side view of a portion of an apparatus for physical vapor deposition illustrating material deposition angles in accordance with at least some embodiments of the present disclosure described above. As shown in FIG. 10, to control the size of the stream 112, 114 of material flux, in addition to the angle of incidence, several parameters can be predetermined, selected, or controlled. For example, a diameter 1012 or width of a target 1002 can be predetermined, selected, or controlled. In addition, a first working distance 1014 from the target the collimator openings 140, 142 can be predetermined, selected, or controlled. A second working distance 1016 from the collimator openings 140, 142 to the substrate 106 can also be predetermined, selected, or controlled. Lastly, the size and number of the collimator openings 140, 142 can be predetermined, selected, or controlled. Taking these parameters into account, the minimum and maximum angles of incidence can be predetermined, selected, or controlled as shown in FIG. 10.

For example, with a given target diameter 1012 of target 1002, working distance 1014, and second working distance 1016, the size of the collimator openings 140, 142 can be set to control a width of the streams 112, 114 of material flux that passes through the opening an impinges upon the substrate 106. For example, the collimator openings 140, 142 can be set to control the minimum and maximum angles of incidence of material from the stream 112, 114 of material flux. For example, lines 1006 and 1004 represent possible paths of material from a first portion of the target 1002 that can pass through the collimator openings 140, 142. Lines 1008 and 1010 represent possible paths of material from a second portion of the target 1002 that can pass through the collimator openings 140, 142. The first and second portions of the target 1002 represent the maximum spread of materials with line of sight paths to the collimator openings 140, 142. The overlap of paths of materials that can travel via line of sight through the collimator openings 140, 142 are bounded by lines 1006 and 1010, which represent the minimum and maximum angles of incidence of material from the streams 112, 114 of material flux that can pass through the opening and deposit on the substrate 106. The angles of 45 degrees and 65 degrees are illustrative. For example, the angle of impingement may generally range between about 10 to about 65 degrees, or more.

While the foregoing is directed to embodiments of the present disclosure, other and further embodiments of the disclosure may be devised without departing from the basic scope thereof.

The invention claimed is:

1. A method for forming structures by asymmetric selective physical vapor deposition (PVD), comprising:
   providing a stream of a first material from a first PVD source towards a surface of a substrate at a first non-perpendicular angle to the substrate surface;
   directing the stream of the first material through a first collimator having at least one opening to limit an angular range of first material passing through the at least one opening;
   depositing the first material only on a top portion and a first sidewall of at least one feature formed on the substrate surface; and
   linearly scanning the substrate through the stream of first material via a substrate support to deposit the first material only on a top portion and a first sidewall of all features formed on the substrate.

2. The method of claim 1, wherein the combination of (1) the angle of the stream of the first material through a first collimator provided by the first PVD source and (2) the physical structure and placement of the collimator controls an angle of incidence that the stream of first material contacts the surface of the substrate.

3. The method of claim 1, wherein the feature is one of a fin, trench, a via, dual damascene feature, or protrudes from the substrate rather than extend into the substrate.

4. The method of claim 1, wherein there is no material deposition on a second sidewall of the feature.

5. The method of claim 4, wherein there is little or no material is deposited on a bottom portion of the feature except in a corner where the bottom portion meets the first sidewall.

6. The method of claim 1, wherein the collimator one of a shroud, a disk, or a plurality of baffles and has one or more openings formed through the collimator such that streams of material flux travels through the collimator.

7. The method of claim 1, wherein the collimator is comprised of a plurality of collimators, each having one or more openings.

8. The method of claim 1, wherein the collimator functions as a spread angle control apparatus that controls the angle of spread of materials being sputtered from the first PVD source.

9. The method of claim 1, wherein collimator moves linearly to change an angle of incidence that the stream of first material contacts the surface of the substrate.

10. A method for forming structures by asymmetric selective physical vapor deposition (PVD), comprising:
    providing a stream of a first material from a first PVD source towards a surface of a substrate at a first non-perpendicular angle to the substrate surface;
    providing a second stream of the first material from a second PVD source towards a surface of a substrate at a second non-perpendicular angle to the substrate surface;
    directing the first and second streams of the first material through a collimator having a plurality of openings to limit the angular ranges of the first and second streams of first material passing through the plurality of openings; and
    linearly scanning the substrate through the first and second streams of the first material via a substrate support to deposit the first material only on (1) a top portion and (2) both a first sidewall and a second sidewall of all features formed on the substrate.

11. The method of claim 10, wherein the combination of (1) the angle of the stream of the first material through a first collimator provided by the first PVD source and (2) the physical structure and placement of the collimator controls an angle of incidence that the stream of first material contacts the surface of the substrate.

12. The method of claim 10, wherein there is little or no material is deposited on a bottom portion of the feature except in a corner where the bottom portion meets the first and second sidewalls.

13. The method of claim 10, wherein the collimator functions as a spread angle control apparatus that controls the angle of spread of materials being sputtered from the first and second PVD sources.

14. The method of claim 10, wherein collimator moves linearly to change an angle of incidence that the stream of first material contacts the surface of the substrate.

15. Apparatus for forming structures by asymmetric selective physical vapor deposition (PVD), comprising:
    a substrate support configured to support a substrate when disposed thereon;
    a first PVD source configured to provide a stream of a first material from towards a surface of the substrate at a first non-perpendicular angle to the substrate surface, wherein the first PVD source is configured to rotate to adjust the angle at which the stream of first material contacts the substrate surface; and
    a collimator having at least one opening to limit an angular range of first material passing through the at least one opening, wherein the collimator is configured to move linearly to control the angle at which the stream of first material contacts the substrate surface.

16. The apparatus of claim 15, wherein the substrate support is configured to rotate about its y-axis between about 0.1 degrees to about 10 degrees to adjust an angle of impingement of the stream of first material on the surface of the substrate.

17. The apparatus of claim 15, further comprising:
    a second PVD source configured to provide a second stream of the first material from towards a surface of a substrate at a second non-perpendicular angle to the substrate surface, wherein the second PVD source is configured to rotate to adjust the angle at which the second stream of first material contacts the substrate surface.

18. The apparatus of claim 15, wherein the collimator one of a shroud, a disk, or a plurality of baffles and has one or more openings formed through the collimator such that streams of material flux travels through the collimator.

19. The apparatus of claim 15, wherein the collimator is comprised of a plurality of collimators, each having one or more openings.

20. The apparatus of claim 15, wherein the linear movement of the collimator is used to adjust an angle of incidence that the stream of first material contacts the substrate surface such that a height of the deposition of material on sidewalls from a bottom portion of the structure is precisely controlled.

* * * * *